US011050343B2

(12) United States Patent
Takegami

(10) Patent No.: US 11,050,343 B2
(45) Date of Patent: Jun. 29, 2021

(54) POWER SUPPLY AND MEDICAL SYSTEM

(71) Applicant: TDK CORPORATION, Tokyo (JP)

(72) Inventor: Eiji Takegami, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/821,167

(22) Filed: Mar. 17, 2020

(65) Prior Publication Data

US 2020/0313545 A1 Oct. 1, 2020

(30) Foreign Application Priority Data

Mar. 25, 2019 (JP) .............................. JP2019-056826

(51) Int. Cl.
*H02M 1/42* (2007.01)
*G01R 31/00* (2006.01)
*G01R 19/165* (2006.01)
*H02M 1/00* (2006.01)

(52) U.S. Cl.
CPC .... *H02M 1/4208* (2013.01); *G01R 19/16585* (2013.01); *G01R 31/00* (2013.01); *H02M 2001/0009* (2013.01)

(58) Field of Classification Search
CPC ................................................ H02M 1/4208
See application file for complete search history.

(56) References Cited

U.S. PATENT DOCUMENTS 8,446,051 B2 * 5/2013 Luthi ..................... H02J 9/005
307/130
10,511,219 B2 * 12/2019 Matsuura .............. H02M 7/217
10,574,135 B2 * 2/2020 Matsuura .............. H02M 7/217

FOREIGN PATENT DOCUMENTS

JP          2006-133046          5/2006

* cited by examiner

*Primary Examiner* — Hai L Nguyen
(74) *Attorney, Agent, or Firm* — Greenblum & Bernstein, P.L.C.

(57) ABSTRACT

A power supply includes: a power factor correction circuit that includes a capacitor and converts an input voltage, produced by rectifying an AC input voltage, to a DC, output voltage; a current detector that detects an inflow current for the power factor correction circuit and outputs a current detection signal; an output voltage detector that detects the output voltage and outputs an output voltage detection signal; a voltage difference detector that detects a voltage difference between maximum and minimum values of a pulsation component of the output voltage detected from the output voltage detection signal; a working life determiner that compares the voltage difference and a threshold and gives notification of end of life of the capacitor when the voltage difference reaches the threshold; and a threshold updater that updates the threshold in keeping with the detected inflow current detected based on the current detection signal.

20 Claims, 5 Drawing Sheets

FIG. 2
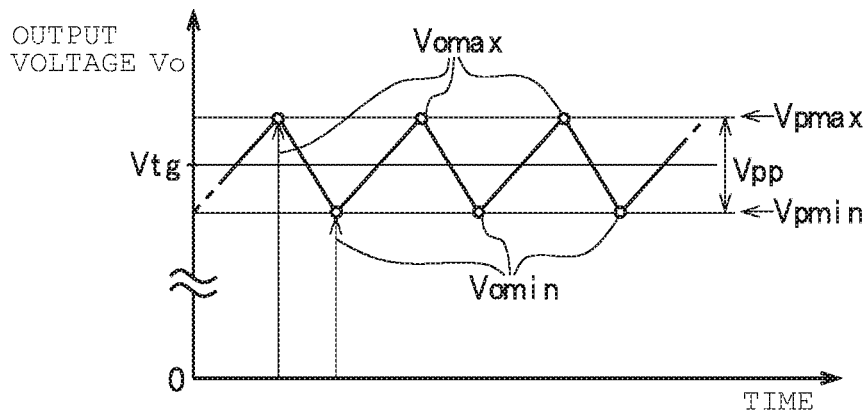
FIG. 3
| INPUT VOLTAGE Vi (AC VOLTAGE Vac) [VAC] | INFLOW CURRENT Ii (Ip) [A] | SUPPLIED POWER [W] | PULSATION AMPLITUDE VALUE Vpp [V] |
|---|---|---|---|
| 100 | 0.39 | 25 | 4.5 |
|  | 0.75 | 50 | 8.4 |
|  | 1.13 | 75 | 12.7 |
|  | 1.47 | 100 | 16.5 |
| 200 | 0.21 | 25 | 4.8 |
|  | 0.39 | 50 | 9.0 |
|  | 0.59 | 75 | 13.4 |
|  | 0.76 | 100 | 17.5 |
FIG. 4
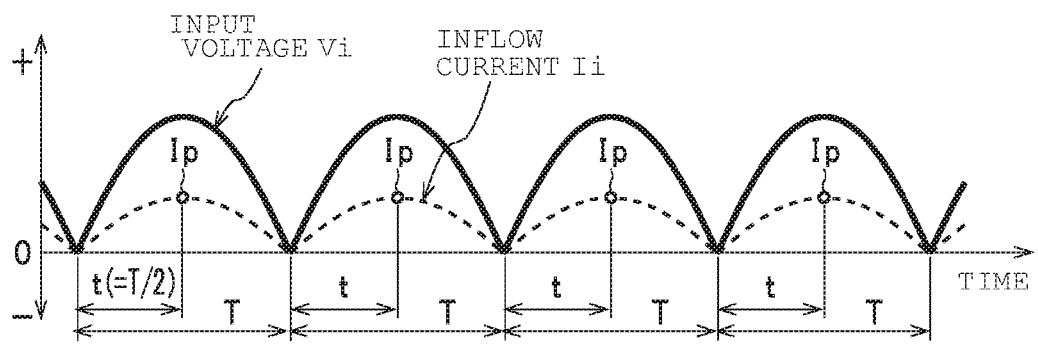

F I G. 8
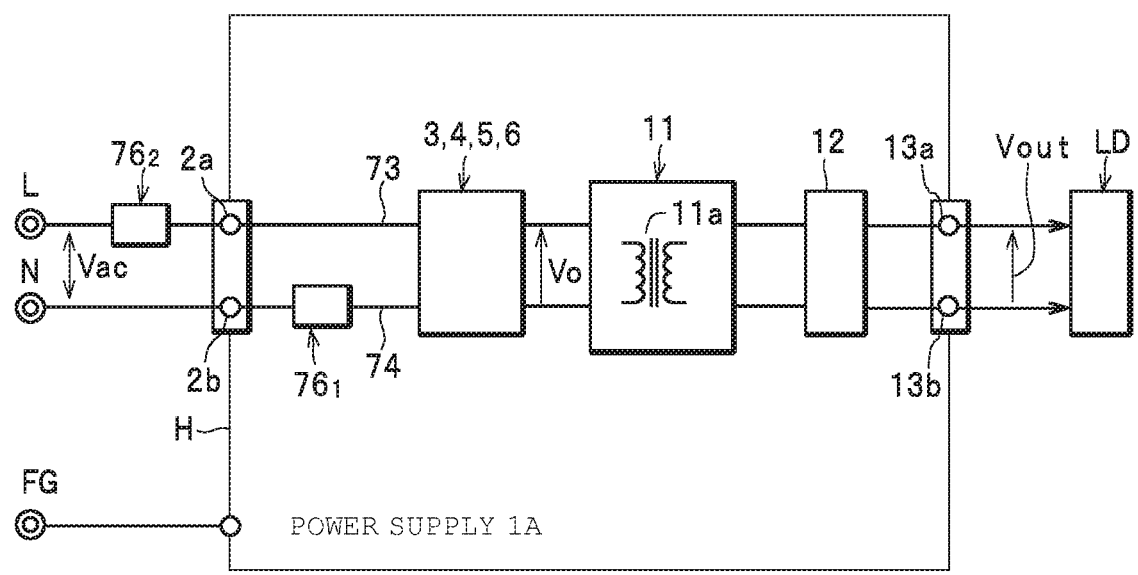

POWER SUPPLY AND MEDICAL SYSTEM

FIELD OF THE INVENTION

The present invention relates to a power supply equipped with a function for determining whether a capacitor has reached the end of its working life and to a medical system equipped with this power supply.

DESCRIPTION OF THE RELATED ART

As one example of a power supply of this type, the present applicant has already proposed the power supply disclosed in Patent Literature 1 (Japanese Laid-open Patent Publication No. 2006-133046). This power supply was conceived by focusing or a characteristic of capacitors, that is, a characteristic whereby due to ageing, the internal impedance progressively increases and there is a loss in capacity, which weakens the smoothing effect on pulsating voltages and results in the pulsation component of a DC output voltage increasing. This power supply is equipped with a detector that detects the pulsation amplitude value of a DC voltage to be smoothed by a capacitor being subject to detection and a capacitor life determiner that outputs an alarm signal when the pulsation amplitude detected value detected by the detector exceeds a pulsation limit standard (a predetermined pulsation limit standard voltage) that is a predetermined standard. This power supply is configured so as to be capable of determining the end of life of a capacitor accurately and in real time in a state where the capacitor is being used. Here, the pulsation limit standard voltage used as a standard is a fixed voltage that is not changed once it has been set. This makes this power supply easy to use for the user, because it is sufficient to set the pulsation limit standard voltage once, with no need for the user to always be present thereafter.

SUMMARY OF THE INVENTION

However, the pulsation component of a DC voltage smoothed by a capacitor does not fluctuate so as to increase only due to the capacitor ageing (that is, deterioration over time) as described above, and also fluctuates when the amount of current (that is, the amplitude of the AC current component) flowing through the capacitor fluctuates (as one example, when the amount of current flowing through the capacitor fluctuates due to fluctuations in the size of the load receiving the DC voltage supplied from the capacitor). Accordingly, although it is desirable to consider not only the former fluctuations but also the latter fluctuations in order to more accurately determine the end of life of a capacitor, it is difficult for a conventional power supply that is configured with a fixed value (fixed voltage) as the standard to more accurately determine whether a capacitor has reached the end of its life.

The present invention was conceived in view of the problem described above and it is a principal object of the present invention to provide a power supply equipped with a function capable of more accurately determining the end of life of a capacitor and a medical system equipped with such power supply.

To achieve the stated object, a power supply according to the present invention comprises: a power factor correction circuit that includes an inductor, a diode, a switch, and a capacitor, converts an input voltage, produced by rectifying an alternating current (AC) voltage, to a direct current (DC) voltage, and outputs the DC voltage; a current detector that detects an inflow current inputted into the power factor correction circuit and outputs a current detection signal; an output voltage detector that detects the DC voltage and outputs an output voltage detection signal; a voltage difference detector that detects one voltage difference value out of a voltage difference value between a maximum value and a minimum value of a pulsation component of the DC voltage detected from the output voltage detection signal, a voltage difference value between a voltage value of the DC voltage at timing where the pulsation component reaches the maximum value and a voltage value of a target voltage for the DC voltage, and a voltage difference value between a voltage value of the DC voltage at timing where the pulsation component reaches the minimum value and the voltage value of the target voltage; a working life determiner that compares the one voltage difference value and a comparison threshold set in advance and gives notification of an end of working life of the capacitor being reached when the voltage difference value has reached the comparison threshold; and a threshold updater that updates the comparison threshold to a threshold in keeping with a current value of the inflow current detected based on the current detection signal.

This means that according to the power supply, by comparing the voltage difference value and the comparison threshold, the working life determiner can directly compare, in a state where the influence of the pulsation component produced at the capacitor due to fluctuations in the inflow current has been greatly reduced (or in other words, with hardly any influence of the pulsation component produced at the capacitor due to the inflow current), the present increase in the pulsation component due to the ageing of the capacitor with the increase in the pulsation component from a state where there is no ageing of the capacitor to a state where ageing has progressed and the end of the working life has been reached. By doing so, it is possible to detect (determine) that the end of the working life of the capacitor has been reached much more accurately.

The power supply according to the present invention further comprises an input voltage detector that detects a voltage produced by rectifying the AC voltage and outputs an input voltage detection signal, wherein the threshold updater updates the comparison threshold to a threshold in keeping with a voltage value of the AC voltage detected based on the input voltage detection signal, out of a plurality of the thresholds for the current value of the inflow current that are present for each voltage value of the AC voltage.

Therefore, according to the power supply, even when an AC voltage (that is, the input voltage) of a different voltage value is inputted, it is possible to calculate a correct new threshold (the comparison threshold) in keeping with the voltage value of the AC voltage and the current value of the inflow current.

A power supply according to the present invention comprises:
a power factor correction circuit that includes an inductor, a diode, a switch, and a capacitor, converts an input voltage, produced by rectifying an AC voltage, to a DC voltage, and outputs the DC voltage; an input voltage detector that detects a voltage produced by rectifying the AC voltage and outputs an input voltage detection signal, a current detector that detects an inflow current inputted into the power factor correction circuit and outputs a current detection signal; an output voltage detector that detects the DC voltage and outputs an output voltage detection signal; a voltage difference detector that detects one voltage difference value out of a voltage difference value between a maximum value and a minimum value of a pulsation component of the DC voltage detected from the output voltage detection signal, a voltage difference value between a voltage value of the DC voltage at timing where the pulsation component reaches the maximum value and a voltage value of a target voltage for the DC voltage, and a voltage difference value between a voltage value of the DC voltage at timing where the pulsation component reaches the minimum value and the voltage value of the target voltage; a working life determiner that compares the one voltage difference value and a comparison threshold set in advance and gives notification of an end of working life of the capacitor being reached when the voltage difference value has reached the comparison threshold; and a threshold updater that updates the comparison threshold to a threshold in keeping with an input power calculated from a current value of the inflow current detected based on the current detection signal and a voltage value of the AC voltage detected based on the input voltage detection signal.

This means that according to the power supply, by comparing the voltage difference value and the comparison threshold, the working life determiner can directly compare, in a state where the influence of the pulsation component produced at the capacitor due to fluctuations in the input power has been greatly reduced (or in other words, with hardly any influence of the pulsation component produced at the capacitor due to the input power), the present increase in the pulsation component due to the ageing of the capacitor with the increase in the pulsation component from a state where there is no ageing of the capacitor to a state where ageing has progressed and the end of the working life has been reached. By doing so, it is possible to detect (determine) that the end of the working life of the capacitor has been reached much more accurately.

In the power supply according to the present invention, on being notified of the end of working life being reached by the working life determiner, the power factor correction circuit causes the switch to stop switching operations.

Therefore, according to the power supply, it is possible to avoid a state where a capacitor that has reached the end of its working life continues to be used A medical system according to the present invention comprises: one of the power supplies described above that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a fuse or a breaker interposed on the pair of power supply lines; and a medical appliance that is connected as the load to the isolation DC/DC converter and operates based on the load voltage.

Therefore, according to the medical system where the above isolation DC/DC converter includes the isolation transformer that has reinforced insulation, since the isolation DC/DC converter further includes the fuse or the breaker on the pair of power supply lines, the power supply is configured so as to be capable of meeting medical standards by itself. This means that it is possible to realize a configuration capable of meeting medical standards without an isolation transformer or a fuse (or breaker) being interposed outside the power supply (in more detail, on the input lines connected to the power supply). Also, according to the above medical system, by including the power supply described above, it is possible to achieve the same effects as the power supply alone described above.

A medical system according to the present invention comprises: one of the power supplies described above that further includes a pair of input terminals connected to an input line, a primary side rectifier that is connected to the pair of input terminals, rectifies the AC voltage inputted via the input line and the pair of input terminals, and outputs as the input voltage to the power factor correction circuit, and an isolation DC/DC converter that generates a load voltage for a corresponding load from the DC voltage and outputs the load voltage; a fuse or a breaker interposed on the input line; and a medical appliance that is connected as the load to the isolation DC/DC converter and operates based on the load voltage.

Therefore, according to the medical system where the isolation DC/DC converter includes the isolation transformer that has reinforced insulation as described above, it is possible to realize a configuration capable of meeting medical standards by merely providing the fuse (or breaker) outside the power supply (in more detail, on the input lines connected to the power supply). Also, according to the medical system, by including the above power supply, it is possible to achieve the same effects as the power supply alone described above.

A medical system according to the present invention comprises: one of the power supplies described above that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a first fuse or a first breaker interposed on one power supply line out of the pair of power supply lines; a second fuse or a second breaker interposed on the input line connected via the input terminals to another power supply line out of the pair of power supply lines; and a medical appliance that is connected as the load to the isolation DC/DC converter and operates based on the load voltage.

Therefore, according to the medical system where the isolation DC/DC converter includes the isolation transformer that has reinforced insulation as described above, the power supply internally further includes the first fuse or the first breaker interposed on one power supply line, by merely interposing the second fuse or the second breaker outside the power supply (in more detail, on the input line connected to the other power supply line out of the input lines connected to the power supply), it is possible to realize a configuration capable of meeting medical standards. Also, according to the medical system, by including the power supply, it is possible to achieve the same effects as the power supply alone described above.

That is, according to the present invention, it is possible to determine whether a capacitor has reached the end of its working life much more accurately in a state where the influence of a pulsation component produced at a capacitor in a power factor correction circuit due to fluctuations in the input power or inflow current has been greatly reduced.

It should be noted that the disclosure of the present invention relates to the contents of Japanese Patent Application No. 2019-056826 that was filed on Mar. 25, 2019, the entire contents of which are herein incorporated by reference.

BRIEF DESCRIPTION OF THE DRAWINGS

These and other objects and features of the present invention will be explained in more detail below with reference to the attached drawings, wherein:

FIG. 2 is a waveform diagram useful in explaining a pulsation amplitude value of a DC voltage;

FIG. 3 is a table useful in explaining the relationship between the pulsation amplitude value, an input voltage, an inflow current, and supplied power;

FIG. 4 is a waveform diagram useful in explaining the input voltage and the inflow current;

FIG. 8 is a diagram depicting another medical system equipped with a power supply.

DESCRIPTION OF THE PREFERRED EMBODIMENTS

Preferred embodiments of a power supply and a medical system will now be described with reference to the attached drawings.

Figure 1:
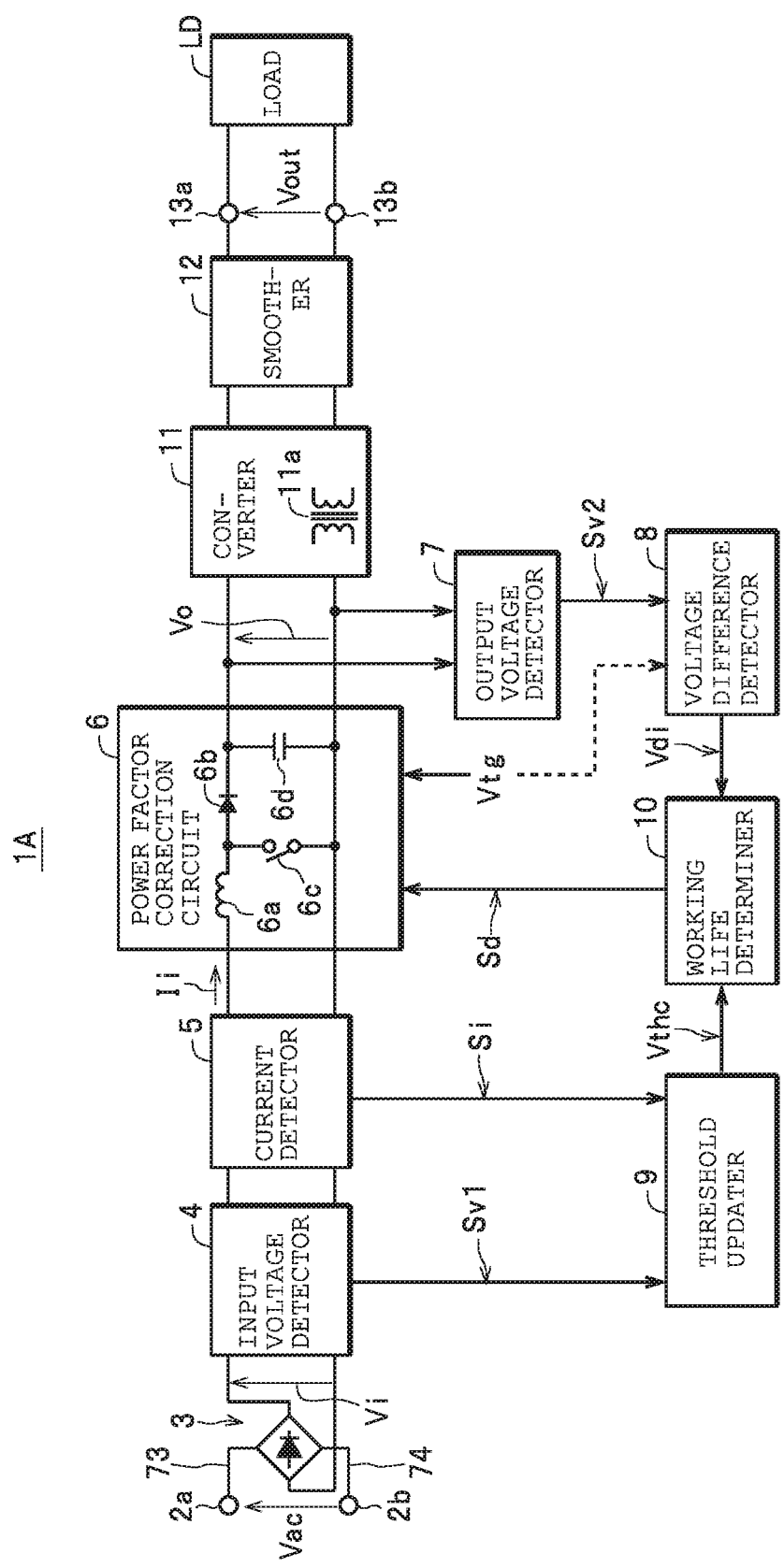
FIG. 1 is a diagram depicting the configuration of a power supply.

First, the configuration of a power supply 1A as one example of a power supply according to the present invention will be described with reference to FIG. 1. As one example, the power supply 1A includes a pair of input terminals 2a and 2b, a primary-side rectifier 3, an input voltage detector 4, a current detector 5, a power factor correction circuit 6, an output voltage detector 7, a voltage difference detector 8, a threshold updater 9, a working life determiner 10, an isolation DC/DC converter (hereinafter simply "converter") 11, a smoother 12, and a pair of output terminals 13a and 13b. An alternating current (AC) input voltage (AC voltage) Vac inputted across the input terminals 2a and 2b is converted to a direct current (DC) output voltage Vout of a voltage value set in advance and outputted. The power supply 1A has a load LD (an electronic appliance or the like) connected to the output terminals 13a and 13b and supplies the DC output voltage Vout to the load LD. Note that although as one example in the present embodiment, the power supply 1A uses a configuration equipped with the converter 11 and the smoother 12, it is also possible to use a configuration where the converter 11 and the smoother 12 are separate to the power supply 1A and are disposed following the power supply 1A.

The pair of input terminals 2a and 2b are connected to an input line, not illustrated, and input the AC input voltage Vac from the input line. The primary-side rectifier 3 is connected via a pair of power supply lines 73 and 74 to the input terminals 2a and 2b and performs full-wave rectification on the AC input voltage Vac, which is a sinusoidal signal, inputted into the input terminals 2a and 2b and outputs as an input voltage (a pulsating voltage) Vi to the power factor correction circuit 6. Note that it is also possible to use a configuration where the primary-side rectifier 3 is disposed outside the power supply 1A and the input voltage Vi is directly inputted into the input terminals 2a and 2b.

The input voltage detector 4 is disposed between the primary-side rectifier 3 and the power factor correction circuit 6, detects the input voltage Vi, and outputs an input voltage detection signal Sv1. As one example, the input voltage detection signal Sv1 is a voltage signal whose voltage value changes in proportion to the voltage value of the input voltage Vi.

The current detector 5 is disposed between the primary-side rectifier 3 and the power factor correction circuit 6, detects a current (hereinafter also referred to as the "inflow current") Ii that flows into the power factor correction circuit 6, and outputs a current detection signal Si. The power factor correction circuit 6 executes a power factor correcting operation, described later, to cause the waveform or the inflow current Ii to follow the waveform (a pulsating waveform) of the input voltage Vi as depicted in FIG. 4. In the present embodiment, the current detector 5 detects the current value of the inflow current Ii that becomes a pulsating waveform in this way and outputs the current detection signal Si (a pulsating waveform signal) with a voltage value in proportion to this current value.

The power factor correction circuit (PFC) 6 includes an inductor 6a, a diode 6b, a switch 6c, a capacitor (an output capacitor) 6d, and a control circuit, not illustrated, that drives the switch 6c. The PFC 6 is configured as one of a step-up power factor correction circuit, a step-down power factor correction circuit, and a step-up/step-down power factor correction circuit (as one example in the present embodiment, a step-up power factor correction circuit as depicted in FIG. 1) and converts the input voltage Vi to a DC voltage Vo which is outputted. The control circuit has an input voltage detecting function, an input, current detecting function, and an output voltage detecting function, and based on the voltage value of the input voltage Vi detected by the input voltage detecting function, the current value of the inflow current Ii detected by the input current detecting function, and the voltage value of the DC voltage Vo detected by the output voltage detecting function, executes pulse width control (pulse width modulation control) over the switch 6c based on the voltage difference between the detected DC voltage Vo and a target voltage Vtg, which is set in advance for the DC voltage Vo.

Due to the control circuit executing pulse width control, the power factor correction circuit 6 executes both a voltage stabilizing operation that stabilizes the DC voltage Vo to the target voltage Vtg and a power factor correcting operation that causes the waveform of the inflow current Ii (that is, the waveform indicated by the broken line) to follow the waveform of the input voltage Vi (that is, the waveform indicated by the thick solid line) as depicted in FIG. 4. When a notification signal SCS, described later, is outputted from the working life determiner 10, the control circuit detects the notification signal Sd and stops the pulse width control (pulse width modulation control) over the switch 6c to stop the voltage stabilizing operation and power factor correcting operation at the power factor correction circuit 6.

The output voltage detector 7 is disposed between the power factor correction circuit 6 and the converter 11, detects the DC voltage Vo, and outputs an output voltage detection signal Sv2. The output voltage detection signal Sv2 is a voltage signal whose voltage value changes in proportion to the voltage value of the DC voltage Vo.

In the present embodiment, the voltage difference detector 8 detects a pulsation component (or "pulsation amplitude value Vpp", see FIG. 2) of the DC voltage Vo that has been smoothed at the capacitor 6d in the power factor correction circuit 6 and outputs as a voltage difference value Vdi. As depicted in FIG. 2, the pulsation amplitude value Vpp is a voltage difference between a maximum value Vpmax and a minimum value Vpmin of the pulsation component of the DC voltage Vo (which has the same cycle as the switching cycle of the switch 6c). As depicted in FIG. 2, the pulsation amplitude value Vpp is also a voltage difference between a voltage value Vomax of the DC voltage Vo at the timing where the pulsation component reaches the maximum value Vpmax and a voltage value Vomin of the DC voltage Vo at the timing where the pulsation component reaches the minimum value Vpmin, and the average value for the voltage value Vomax and the voltage value Vomin is the target voltage Vtg. Accordingly, a voltage difference (Vomax−Vtg) between the voltage value Vomax and the target voltage Vtg and a voltage difference (Vtg−Vomin) between the voltage value Vomin and the target voltage Vtg are both values that are equal to half of the pulsation amplitude value Vpp and are equivalent to the pulsation amplitude value Vpp itself in functioning as a characteristic value (or a parameter value) indicating ageing (or the end of life) of the capacitor 6d. For this reason, instead of being configured to detect the pulsation amplitude value Vpp, it is also possible for the voltage difference detector 8 to use a configuration that detects one of the voltage difference (Vomax−Vtg) and the voltage difference (Vtg−Vomin) and outputs as the voltage difference value Vdi.

It has been confirmed that the pulsation amplitude value Vpp not only increases with ageing of the capacitor 6d (that is, gradually increases over time) but also fluctuates with fluctuations in the power (a supplied power) supplied from the power factor correction circuit 6 to a downstream circuit (that is, the pulsation amplitude value Vpp increases and decreases substantially in proportion to increases and decreases in the supplied power). This is because the current flowing through the capacitor 6d (that is, the amplitude of the AC current component) also fluctuates substantially in proportion to the fluctuations in the supplied power. This is also demonstrated by the simulation results depicted in FIG. 3. The pulsation amplitude values Vpp depicted in FIG. 3 are values calculated from the supplied power (or from the voltage value of the AC input voltage Vac (the input voltage Vi) and the current value of the inflow current Ii). Note that in these simulation results, when the supplied power is the same but the input voltage Vi (the AC input voltage Vac) differs, the pulsation amplitude value Vpp does slightly differ but only with a small actual difference (as one example, when the supplied power is 25 W, the pulsation amplitude value Vpp is 4.5V when the input voltage Vi is 100V, but when the supplied power is the same at 25 W, the pulsation amplitude value Vpp is 4.8V when the input voltage Vi is 200V). For this reason, as described above, the pulsation amplitude value Vpp can be treated as a value that increases and decreases substantially in proportion to increases and decreases in the supplied power regardless of the value of the input voltage Vi (the AC input voltage Vac).

Since the pulsation amplitude value Vpp is a parameter that increases and decreases substantially in proportion to increases and decreases in the supped power, when the input voltage Vi (the AC input voltage Vac) is fixed (in the example depicted in FIG. 3, the input voltage Vi (the AC input voltage Vac) is fixed at one of 100V and 200V), the pulsation amplitude value Vpp will fluctuate substantially in proportion to fluctuations in the current value of the inflow current Ii (the peak value Ip is used as the current value in FIG. 3, but the root-mean-square value or average value of the inflow current Ii may be used instead). As one example, when, in a case where the input voltage Vi is 100V and the present supplied power to the load LD is 50 W, the load LD becomes heavier and the supplied power increases from a present state (that is, when the inflow current Ii increases), the pulsation amplitude value Vpp will also increase. Conversely, when the load LD becomes lighter and the supplied power decreases from the present state described above (that is, when the inflow current Ii decreases), the pulsation amplitude value Vpp will also decrease.

The pulsation amplitude value Vpp is actually measured at the voltage difference detector 8 and is also calculated as described later at the threshold updater 9. For this reason, to distinguish between the pulsation amplitude value Vpp (a measured value) at the voltage difference detector 8 and the pulsation amplitude value Vpp (a theoretical value) at the threshold updater 9, the former will be referred to as the "pulsation amplitude value Vpp1" and the latter will be referred to as the "pulsation amplitude value Vpp2". When not distinguishing between the two values, the expression "pulsation amplitude value Vpp" is used.

The threshold updater 9 detects the voltage value of the input voltage Vi based on the input voltage detection signal Sv1 (as a result, the voltage value of the AC input voltage Vac) and detects the current value of the inflow current Ii based on the current detection signal Si. Based on the voltage value of the input voltage Vi and the current value of the inflow current Ii that have been detected, the threshold updater 9 also calculates a new threshold for updating a comparison threshold Vthc, described later, used in the working life determiner 10 and outputs the new threshold to the working life determiner 10 as the comparison threshold Vthc.

For the detection of the voltage value and the current, value, as depicted in FIG. 4, the threshold updater 9 may use a configuration that detects root-mean-square values in one cycle T of the input voltage Vi and the inflow current Ii, which are pulsating signals with the cycle T (which is half the cycle of the AC input voltage Vac), as the voltage value and the current value described above, a configuration that detects average values in place of the root-mean-square values, or a configuration that detects the voltage value and current value at timing that is set in advance in one cycle T for the input voltage Vi and the inflow current Ii (in more detail, the voltage value and the current value at a time where a certain time t (<T) has elapsed from the timing of a rise in the waveform). In the present embodiment, the threshold updater 9 uses a configuration that detects the root-mean-square value for the input voltage Vi (the AC input voltage Vac) as the voltage value, and detects the current value at timing that is set in advance for the inflow current Ii (as one example, the current value at a time where a certain time t(=T/2) has elapsed from the timing of a rise in the waveform, that is, the peak value Ip) as the current value.

The reason for updating the comparison threshold Vthc used in the working life determiner 10 will now be described. The pulsation amplitude value Vpp does not vary merely due to ageing of the capacitor 6d but also varies due to fluctuations in the supplied power caused by fluctuations in the load LD. That is, to precisely distinguish ageing of the capacitor 6d, it is necessary to adjust the comparison threshold Vthc in keeping with the supplied power.

As described later, the working life determiner 10 compares the voltage difference value Vdi (in the present embodiment, the pulsation amplitude value Vpp1) with the comparison threshold Vthc and determines that the capacitor 6d has reached the end of its working life when the pulsation amplitude value Vpp1 reaches the comparison threshold Vthc. To do so, in a state where the ageing of the capacitor 6d has not progressed as far as a state regarded as the end of the working life being reached, when the pulsation amplitude value Vpp1 fluctuates due to fluctuations in the load LD, the threshold updater 9 updates the comparison threshold Vthc to be used at the working life determiner 10 to a threshold in keeping with the size of the load LD (that is, to a threshold in keeping with the magnitude of the supplied power or the current value of the inflow current Ii) so that the working life determiner 10 does not erroneously determine that the capacitor 6d has reached the end of its working life.

The method by which the threshold updater 9 calculates the new threshold will now be described. Note that it is assumed here that the threshold updater 9 stores, for a condition that the load LD is constant (that is, the supplied power supplied to the load LD or the inflow current Ii is constant), an increase in the pulsation amplitude value Vpp from a state (or "initial state") where there is no ageing of the capacitor 6d to a state where ageing has progressed and the end of life has been reached as an "increase ΔVppr" (a fixed value) that is calculated in advance through simulation or the like.

First, the threshold updater 9 calculates the input power inputted into the power factor correction circuit 6 based on the voltage value of the input voltage Vi and the current value of the inflow current Ii that have been detected. For ease of understanding the present invention, the power loss at the power factor correction circuit 6 is assumed to be zero, which makes it possible to regard the calculated input power as equivalent to the supplied power supplied to the load LD from the power factor correction circuit 6. The pulsation amplitude value Vpp fluctuates substantially in proportion to fluctuations in the supplied power. Accordingly, based on the calculated input power, the threshold updater 9 calculates the pulsation amplitude value Vpp predicted to appear at the capacitor 6d for that input power as the pulsation amplitude value Vpp2 (a theoretical value) using the same method as when the pulsation amplitude values Vpp in FIG. 3 were calculated.

Also, as described above, when the input voltage Vi (the AC input voltage Vac) is fixed, the pulsation amplitude value Vpp fluctuates substantially in proportion to fluctuations in the current value of the inflow current Ii. This means that it is possible for the threshold updater 9 to use a configuration that calculates, based on the detected current value of the inflow current Ii, the pulsation amplitude value Vpp2 that is predicted to appear at the capacitor 6d for that current value with consideration to the detected voltage value of the input voltage Vi. When this configuration is used, as one example, a look-up table (that is, a table in which the pulsation amplitude value Vpp2 for each current value when the current value of the inflow current Ii changes is associated with each input voltage Vi) produced by omitting the supplied power column from the table depicted in FIG. 3 is generated in advance and is stored in the threshold updater 9. In this state, the threshold updater 9 newly specifies (calculates) a pulsation amplitude value Vpp2 in keeping with the detected voltage value of the input voltage Vi (the AC input voltage Vac) out of the pulsation amplitude values Vpp (in this case, the pulsation amplitude values Vpp2) for the current values of the inflow current Ii given for each voltage value (for the examples in FIG. 3, 100V and 200V) of the input voltage Vi (the AC input voltage Vac).

For a detailed example where various values of the input voltage Vi (the AC input voltage Vac), the inflow current Ii, and the pulsation amplitude value Vpp2 are stored so as to be associated with each other as depicted in FIG. 3 in a look-up table, when the detected voltage value of the input voltage Vi is 100V and the detected current value of the inflow current Ii is 0.39 A, the threshold updater 9 newly specifies (calculates) the pulsation amplitude value Vpp2 (4.5V) in keeping with the detected voltage value (100V) of the input voltage Vi (the AC input voltage Vac) out of the pulsation amplitude values Vpp2 (a pulsation amplitude value Vpp2 of 4.5V for when the input voltage Vi is 100V and a pulsation amplitude value Vpp2 of 9.0V for when the input voltage Vi is 200V) for the current value (0.39 A) of the inflow current Ii present for the voltage values (100V and 200V) of the input voltage Vi (the AC input voltage Vac).

Next, the threshold updater 9 specifies (calculates) a value produced by adding the increase ΔVppr described above to the pulsation amplitude value Vpp2 (the theoretical value) specified (calculated) as described above (that is, the threshold updater 9 calculates Vpp2+ΔVppr) as a new threshold and outputs this new threshold as the comparison threshold Vthc to the working life determiner 10 to update the comparison threshold Vthc used by the working life determiner 10.

Note that it is also possible for the threshold updater 9 to be configured to use a table in which values produced by adding the increase ΔVppr to the pulsation amplitude values Vpp2 (that is, threshold values) are stored as a threshold table in place of the pulsation amplitude values Vpp2 in the look-up table described above. With this configuration, the threshold updater 9 is capable of directly specifying (calculating) a threshold corresponding to the detected voltage value of the input voltage Vi (the AC input voltage Vac) out of the thresholds for the current value of the inflow current Ii present for each voltage value of the input voltage Vi (the AC input voltage Vac) as the new threshold (the new comparison threshold Vthc).

The working life determiner 10 compares the voltage difference value Vdi (in the present embodiment, the pulsation amplitude value Vpp1) outputted from the voltage difference detector 8 with the comparison threshold Vthc set in advance and outputs, when the voltage difference value Vdi has reached the comparison threshold Vthc, the notification signal Sd giving notification of the end of life of the capacitor 6d. The working life determiner 10 uses the comparison threshold Vthc (=Vpp2+ΔVppr) outputted from the threshold updater 9 as the comparison threshold Vthc. By using this configuration, the working life determiner 10 updates and uses the comparison threshold Vthc every time a new comparison threshold Vthc is outputted from the threshold updater 9.

As one example, the converter 11 is constructed of an isolation DC/DC converter with an isolation transformer 11a, converts the DC voltage Vo outputted from the power factor correction circuit 6 to a DC output voltage Vout for the load LD, and outputs the DC output voltage Vout. The smoother 12 is constructed of a low-pass filter or the like, removes a high-frequency component such as switching noise included in the DC output voltage Vout, and outputs the DC output voltage Vout from which the noise has been removed via the pair of output terminals 13a and 13b to the load LD.

Next, the operation of the power supply 1A will be described. Note that as one example, it is assumed here that an input voltage Vi (an AC input voltage Vac) with a fixed root-mean-square value is being supplied to the input terminals 2a and 2b and the load LD connected to the output terminals 13a and 13b is operating at first in its rated state (that is, a state where the normal amount of supplied power is being supplied from the power supply 1A).

In the power supply 1A, the primary-side rectifier 3 performs full-wave rectification on the AC input voltage Vac inputted into the input terminals 2a and 2b and outputs as the input voltage Vi to the power factor correction circuit 6. The power factor correction circuit 6 executes a voltage stabilizing operation, which generates the DC voltage Vo based on the input voltage Vi and stabilizes the DC voltage Vo to the target voltage Vtg, and a power factor correcting operation, which causes the waveform of the inflow current Ii to follow the waveform of the input voltage Vi. The converter 11 converts the DC voltage Vo outputted from the power factor correction circuit 6 to the DC output voltage Vout for the load LD and outputs the DC output voltage Vout. The smoother 12 removes high-frequency components, such as switching noise, included in the DC output voltage Vout and outputs the DC output voltage Vout from which the noise has been removed via the pair of output terminals 13*a* and 13*b* to the load LD.

Also, in the power supply 1A, the input voltage detector 4 detects the input voltage Vi and outputs the input voltage detection signal Sv1 to the threshold updater 9 and the current detector 5 detects the inflow current Ii and outputs the current detection signal Si to the threshold updater 9. The output voltage detector 7 detects the DC voltage Vo and outputs the output voltage detection signal Sv2 to the voltage difference detector 8.

The voltage difference detector 8 detects the pulsation amplitude value Vpp1 of the DC voltage Vo based on the output voltage detection signal Sv2 and outputs as the voltage difference value Vdi. Here, the detected pulsation amplitude value Vpp1 is a value (Vpp1=Vppa+$\Delta$Vppc) produced by adding a present increase $\Delta$Vppc due to ageing of the capacitor 6*d* to the pulsation amplitude value Vppa which corresponds to the magnitude of the supplied power supplied from the power factor correction circuit 6 to the load LD.

The threshold updater 9 detects the voltage value of the input voltage Vi (the AC input voltage Vac) based on the input voltage detection signal Sv1 and detects the current value of the inflow current Ii based on the current detection signal Si. Next, the threshold updater 9 calculates the input power into the power factor correction circuit 6 (which is equivalent to the supplied power supplied to the load LD from the power factor correction circuit 6) based on the voltage value of the input voltage Vi and the current value of the inflow current Ii that have been detected. After this, based on the calculated supplied power, the threshold updater 9 calculates the pulsation amplitude value Vpp2 (a theoretical value) at the capacitor 6*d* that is produced due to the calculated supplied power for a state where the calculated supplied power is being supplied from the power factor correction circuit 6 to the load LD. The threshold updater 9 also adds the increase $\Delta$Vppr to the calculated pulsation amplitude value Vpp2 to specify (calculate) the new threshold (Vpp2+$\Delta$Vppr) and outputs this new threshold to the working life determiner 10 as the comparison threshold Vthc to update the comparison threshold Vthc used at the working life determiner 10.

The working life determiner 10 compares the voltage difference value Vdi (the pulsation amplitude value Vpp1 (=Vppa+$\Delta$Vppc)) outputted from the voltage difference detector 8 and the new comparison threshold Vthc (=Vpp2+$\Delta$Vppr) outputted from the threshold updates 9 and outputs, when the voltage difference value Vdi has reached the comparison threshold Vthc, the notification signal Sd notifying that the end of life of the capacitor 6*d* has been reached.

Here, as described above, since the pulsation amplitude value Vpp2 used to calculate the comparison threshold Vthc is a theoretical value of the pulsation amplitude value Vpp produced at the capacitor 6*d* in keeping with the supplied power supplied from the power factor correction circuit 6 to the load LD at the present time, it is possible to regard this as being a value substantially equal to the pulsation amplitude value Vppa used to calculate the pulsation amplitude value Vpp1 (that is, the pulsation amplitude value Vpp (the measured value) at the present time that corresponds to the magnitude of the supplied power actually supplied from the power factor correction circuit 6 to the load LD). That is, it is possible to regard the relationship "pulsation amplitude value Vpp2$\fallingdotseq$pulsation amplitude value Vppa" as being satisfied.

This means that by comparing the voltage difference value Vdi (the pulsation amplitude value Vpp1(=Vppa+$\Delta$Vppc)) and the comparison threshold Vthc (=Vpp2+$\Delta$Vppr), the working life determiner 10 can directly compare the present increase $\Delta$Vppc due to the ageing of the capacitor 6*d* with the increase $\Delta$Vppr in the pulsation amplitude value Vpp from the state where there is no ageing in the capacitor 6*d* until the ageing progresses and the end of life is reached, in a state where the influence of the pulsation amplitude value Vpp produced at the capacitor 6*d* due to the supplied power has been greatly reduced (that is, with hardly any influence of the pulsation amplitude value Vpp produced at the capacitor 6*d* due to the supplied power).

Accordingly, when the working life determiner 10 compares the voltage difference value Vdi (the pulsation amplitude value Vpp1(=Vppa+$\Delta$Vppc)) and the comparison threshold Vthc (=Vpp2+$\Delta$Vppr) and the pulsation amplitude value Vpp1 indicated by the voltage difference value Vdi has not reached the comparison threshold Vthc (which is equivalent to the increase $\Delta$Vppc described above not reaching the increase $\Delta$Vppr described above, that is, the end of the working life of the capacitor 6*d* not being reached), the working life determiner 10 does not output the notification signal Sd giving notification of the end of the working life of the capacitor 6*d* being reached.

On the other hand, when the working life determiner 10 compares the voltage difference value Vdi (the pulsation amplitude value Vpp2) and the comparison threshold Vthc and the pulsation amplitude value Vpp1 has reached the comparison threshold Vthc (which is equivalent to the increase $\Delta$Vppc reaching the increase $\Delta$Vppr, or in other words, the end of the working life of the capacitor 6*d* being reached), the working life determiner 10 outputs the notification signal Sd giving notification of the end of the working life of the capacitor 6*d* being reached. In this case, at the power factor correction circuit 6, the control circuit detects the outputting of the notification signal Sd and stops the pulse width control of the switch 6*c*. By doing so, the power factor correction circuit 6 stops the voltage stabilizing operation and the power factor correcting operation. Accordingly, in the power supply 1A, it is possible to avoid a situation where a capacitor 6*d* that has reached the end of its working life continues to be used.

In this way, in the power supply 1A according to the present embodiment, the threshold updater 9 specifies (calculates) a threshold in keeping with the input power inputted into the power factor correction circuit 6 (which is equivalent to the supplied power from the power factor correction circuit 6 to the load LD) calculated from the voltage value of the input voltage Vi detected based on the input voltage detection signal Sv1 and the current value of the inflow current Ii detected based on the current detection signal Si. By outputting this threshold to the working life determiner 10 as the comparison threshold Vthc, the comparison threshold Vthc used in the working life determiner 10 is updated.

This means that according to the power supply 1A, by comparing the voltage difference value Vdi (the pulsation amplitude value Vpp1) and the comparison threshold Vthc, it is possible to directly compare, in a state where the influence of the pulsation amplitude value Vpp produced at the capacitor 6d due to the supplied power has been greatly reduced (or in other words, with hardly any influence of the pulsation amplitude value Vpp produced at the capacitor 6d due to the supplied power), the present increase ΔVppc due to the ageing of the capacitor 6d with the increase ΔVppr in the pulsation amplitude value Vpp from a state where there is no ageing of the capacitor 6d to a state where ageing has progressed and the end of the working life has been reached. By doing so, it is possible to detect (determine) that the end of the working life of the capacitor 6d has been reached much more accurately.

Also, according to the power supply 1A, when the working life determiner 10 has outputted the notification signal Sd that indicates that the end of the working life of the capacitor 6d has been reached, the power factor correction circuit 6 stops the pulse width control of the switch 6c (that is, the switching operation of the switch 6c is stopped), which makes it possible to avoid a state where a capacitor 6d that has reached the end of its working life continues to be used. Note that although not illustrated, in place of the configuration described above where the power factor correction circuit 6 stops the switching operations of the switch 6c when the notification signal Sd is outputted, or in addition to this configuration, it is also possible to use a configuration where an outputter (a display device such as a computer display or an audio output device such as a speaker or a buzzer) is disposed at the power supply device and when the notification signal 3d is outputted, the periphery is notified from this outputter that the end of the working life of the capacitor 6d has been reached. When the outputter is a display device, a display indicating that the end of the working life has been reached is displayed, while when the outputter is an audio output device, a sound indicating that the end of the working life has been reached is outputted.

Note that in place of a configuration that specifies (calculates) the threshold in keeping with the input power (which is equivalent to the supplied power supplied from the power factor correction circuit 6 to the load LD) inputted into the power factor correction circuit 6 calculated from the voltage value of the input voltage Vi detected based on the input voltage detection signal Sv1 and the current value of the inflow current Ii detected based on the current detection signal Si, when the voltage value of the input voltage Vi (the AC input voltage Vac) is fixed, as described above, the threshold updater 9 may use a configuration that specifies (calculates) the threshold in keeping with the current value of the inflow current Ii detected based on the current detection signal Si. As one example, since the commercial AC voltage that is normally used as the AC input voltage Vac in the present embodiment is constant (fixed) on a countrywide basis, it is possible to use this configuration when there is a limitation on the countries where the power supply 1A is used. With the power supply 1A of this configuration also, it is possible to achieve the same effects as the configuration described above (that is, the effect of detecting whether the end of the working life of the capacitor 6d has been reached much more accurately).

Even when this configuration is used (that is, a configuration where the threshold is specified (calculated) in keeping with the current value of the inflow current Ii), it is preferable to configure the power supply 1A so as to allow use in countries with different commercial AV voltages (the AC input voltage Vac in the present embodiment). This configuration is also capable of being adapted to a configuration where the threshold updater 9 uses the look-up table or the threshold table described above. In a configuration that uses the look-up table, the threshold updater 9 newly specifies (calculates) the pulsation amplitude value Vpp2 in keeping with the detected voltage value of the input voltage Vi (the AC input voltage Vac) out of the pulsation amplitude values Vpp2 for the current value of the inflow current Ii present for each voltage value of the input voltage Vi (the AC input voltage Vac) and by adding the increase ΔVppr to the pulsation amplitude value Vpp2, calculates the new threshold (the comparison threshold Vthc). With a configuration that uses the threshold table described above, the threshold updater 9 directly specifies (calculates) a threshold in keeping with the detected voltage value of the input voltage Vi (the AC input voltage Vac) out of the thresholds for the current value of the inflow current Ii present for each voltage value of the input voltage Vi (the AC input voltage Vac) as the new threshold (the comparison threshold Vthc). By doing so, even when a commercial AC voltage (in the present embodiment, the AC input voltage Vac) of a different voltage value is inputted, the power supply 1A is capable of calculating a correct new threshold (the comparison threshold Vthc) in keeping with the voltage value of the commercial AC voltage (in the present embodiment, the AC input voltage Vac) and the current value of the inflow current Ii.

Figure 5:
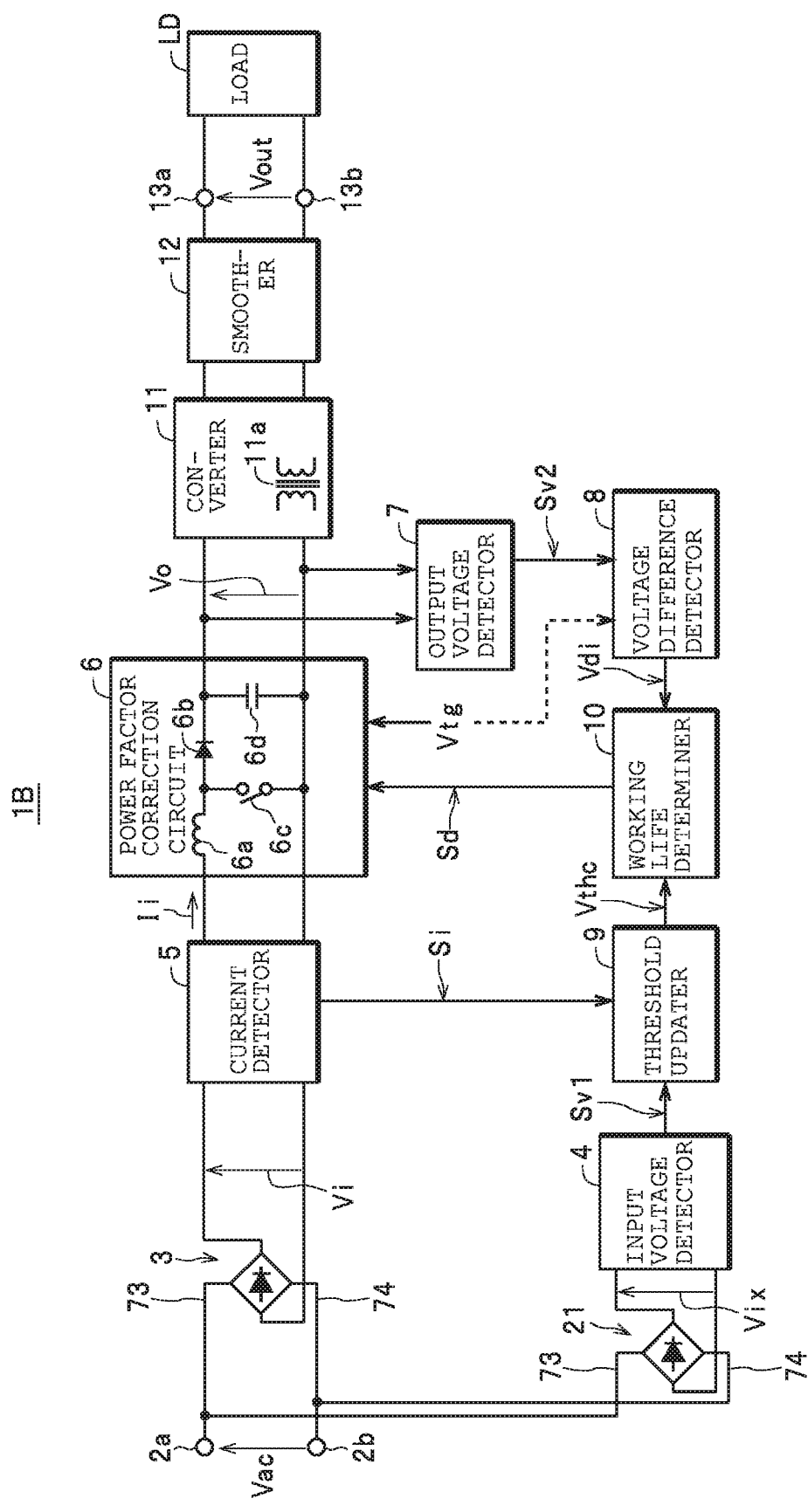
FIG. 5 is a diagram depicting the configuration of a power supply.

Note that in the power supply 1A described above, although a configuration where the input voltage detector 4 is disposed between the primary-side rectifier 3 and the power factor correction circuit 6 is used, the configuration that detects the voltage value of the input voltage Vi inputted into the power factor correction circuit 6 is not limited to this. As one example, like a power supply 1B depicted in FIG. 5, it is also possible to use a configuration where another primary-side rectifier 21 that is connected via the pair of power supply lines 73 and 74 to the input terminals 2a and 2b is disposed so as to be parallel to the primary-side rectifier 3 and the input voltage detector 4 detects a voltage Vix (a voltage that is equivalent to the input voltage Vi described above), which is outputted by the primary-side rectifier 21 after full-wave rectification of the AC input voltage Vac, and outputs the input voltage detection signal Sv1. Note that since other parts of the configuration are the same as the power supply 1A, the same reference numerals have been assigned and duplicated description has been omitted.

The input voltage detection signal Sv1 of the power supply 1B is the same as the input voltage detection signal Sv1 described above of the power supply 1A. Accordingly, the power supply 1B is capable of achieving the same effect as the power supply 1A described above.

It is possible to use the power supplies 1A and 1B described above in a medical system by connecting a medical appliance as the load LD to the output terminals 13a and 13b. Although an example medical system that uses the power supply 1A is described below, the same applies when the power supply 1B is used.

Figure 6:
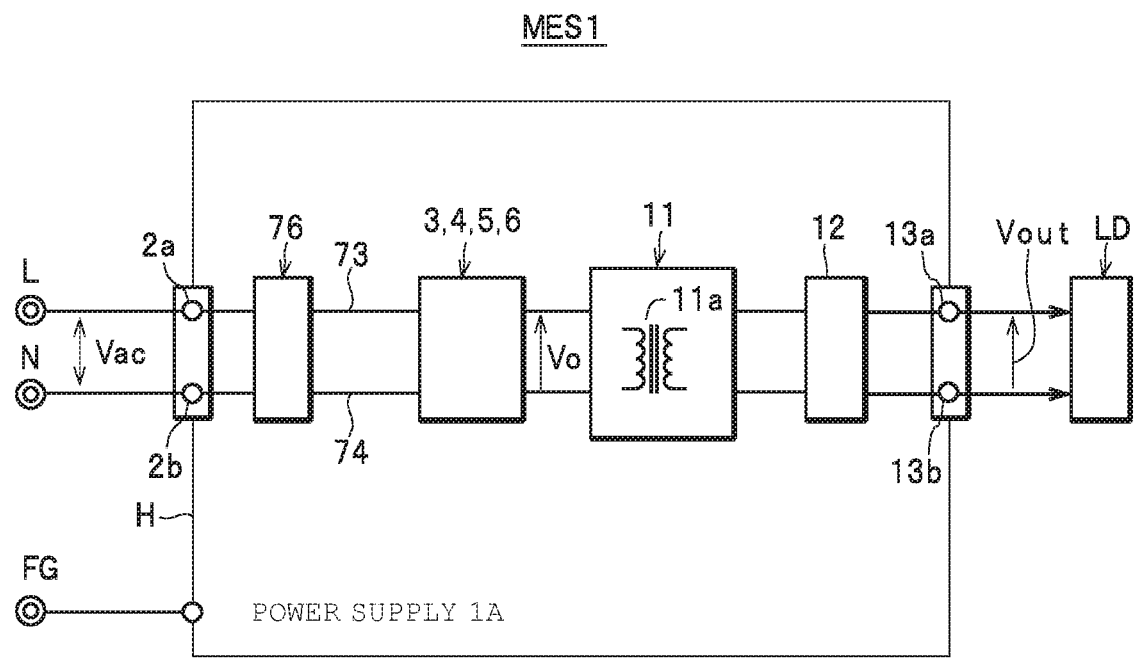
FIG. 6 is a diagram depicting a medical system equipped with a power supply.

A medical system MES1 equipped with the power supply 1A will now be described with reference to FIG. 6. Note that it is assumed here that the isolation transformer 11a disposed in the converter 11 of the power supply 1A is sufficiently isolated to meet medical standards (that is, the isolation transformer 11a has reinforced insulation). It is further assumed that an FG line for grounding is connected to a housing H of the power supply 1A. The medical appliance as the load LD operates based on the DC output voltage Vout as the load voltage outputted from the power supply 1A. Configurations that are the same as the configurations of the power supply 1A described above have been assigned the same reference numerals and duplicated description is omitted. Note also that the output voltage detector 7, the voltage difference detector 8, the threshold updater 9, and the working life determiner 10 have been omitted from FIG. 6.

In this system, the power supply 1A operates by inputting an AC input voltage Vac supplied across input lines (an L-phase line and an N-phase line) via the pair of input terminals 2a and 2b. To do so, the power supply 1A internally includes a fuse 76 (or breaker) interposed on a pair of power supply lines 73 and 74.

According to the medical system MES1 equipped with the power supply 1A, the power supply 1A is equipped with the isolation transformer 11a that has reinforced insulation and the fuse 76 as described above and is configured so as to be capable of meeting medical standards by itself. This means that it is possible to realize a configuration capable of meeting medical standards without an isolation transformer and a fuse (or breaker) being provided outside the power supply 1A (in more detail, on the input lines (the L-phase line and the N-phase line) connected to the power supply 1A). Also, according to the medical system MES1, by including the power supply 1A, it is possible to achieve the same effects as the power supply 1A alone described above.

Also, although the power supply 1A in the medical system MES1 described above internally includes the fuse 76 (or breaker), it is also possible to configure a medical system using a power supply 1A that does not internally include the fuse 76 (or breaker). A medical system MES2 that uses this configuration will now be described with reference to FIG. 7. Note that configurations that are the same as the medical system MES1 described above have been assigned the same reference numerals and duplicated description is omitted, with the following description instead focusing on configurations that differ to the medical system MES1.

Figure 7:
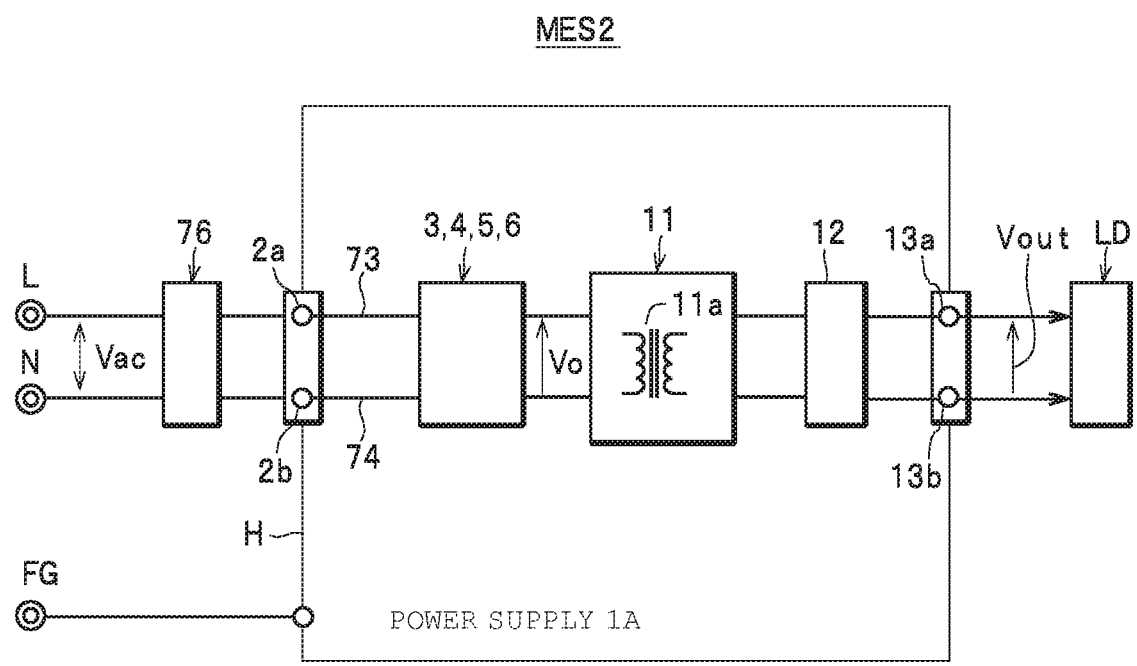
FIG. 7 is a diagram depicting another medical system equipped with a power supply.

As depicted in FIG. 7, in this medical system MES2, the fuse 76 (or breaker) is interposed on the input lines (the L-phase line and the N-phase line). With this configuration, the AC input voltage Vac supplied across the input lines (the L-phase line and the N-phase line) is inputted into the input terminals 2a and 2b of the power supply 1A via the fuse 76 (or breaker).

According to the medical system MES2 equipped with the power supply 1A, since the power supply 1A includes the isolation transformer 11a that has reinforced insulation as described above, it is possible to realize a configuration capable of meeting medical standards by merely providing the fuse 76 (or breaker) outside the power supply 1A (an more detail, on the input lines (the L-phase line and the N-phase line) connected to the power supply 1A). Also, according to the medical system MES2, by including the power supply 1A, it is possible to achieve the same effects as the power supply 1A alone described above.

Although the medical systems MES1 and MES2 described above are configured with the fuse 76 (or breaker) interposed only one of inside and outside the power supply 1A, it is also possible to use a configuration where a fuse 76 (or breaker) is interposed both inside and outside the power supply 1A. A medical system MES3 that uses this configuration will now be described with reference to FIG. 8. Note that configurations that are the same as the medical systems MES1 and MES2 described above have been assigned the same reference numerals and duplicated description is omitted, with the following description instead focusing on configurations that differ to the medical systems MES1 and MES2.

In the medical system MES5, the power supply 1A internally includes a fuse $76_1$ as a first fuse (or a breaker as a first breaker) that is interposed on one power supply line (as one example in the present embodiment, the power supply line 74) out of the pair of power supply lines 73 and 74. Additionally, a fuse $76_2$ as a second fuse (or a breaker as a second breaker) disposed outside the power supply 1A in a state where the fuse $76_2$ is interposed on an input line (in the present embodiment, the L-phase line) connected via an input terminal (in the present embodiment, the input terminal 2a) to the other power supply line (as one example in the present embodiment, the power supply line 73) out of the pair of power supply lines 73 and 74. Note that although not illustrated, it is also possible to use a configuration where the fuse $76_1$ as the first fuse (or a breaker as the first breaker) is interposed on the power supply line 73 and corresponding to this, the fuse $76_2$ as the second fuse (or a breaker as the second breaker) is interposed on the N-phase line.

According to the medical system MES3 equipped with the power supply 1A, since the power supply 1A internally includes the isolation transformer 11a that has reinforced insulation as described above and the fuse $76_1$ (breaker) interposed on one power supply line (the power supply line 74 or the power supply line 73), by merely interposing the other fuse $76_2$ (or breaker) outside the power supply 1A (in more detail, on the input line (the L-phase line or the N-phase line) connected to the other power supply line out of the input lines (the L-phase line and the N-phase line) connected to the power supply 1A), it is possible to realize a configuration capable of meeting medical standards. Also, according to the medical system MES3, by including the power supply 1A, it is possible to achieve the same effects as the power supply 1A alone described above.

What is claimed is:
1. A power supply comprising:
a power factor correction circuit that includes an inductor, a diode, a switch, and a capacitor, converts an input voltage, produced by rectifying an alternating current (AC) voltage, to a direct current (DC) voltage, and outputs the DC voltage;
a current detector that detects an inflow current inputted into the power factor correction circuit and outputs a current detection signal;
an output voltage detector that detects the DC voltage and outputs an output voltage detection signal;
a voltage difference detector that detects one voltage difference value out of a voltage difference value between a maximum value and a minimum value of a pulsation component of the DC voltage detected from the output voltage detection signal, a voltage difference value between a voltage value of the DC voltage at timing where the pulsation component reaches the maximum value and a voltage value of a target voltage for the DC voltage, and a voltage difference value between a voltage value of the DC voltage at timing where the pulsation component reaches the minimum value and the voltage value of the target voltage;
a working life determiner that compares the one voltage difference value and a comparison threshold set in advance and gives notification of an end of working life of the capacitor being reached when the voltage difference value has reached the comparison threshold; and a threshold updater that updates the comparison threshold to a threshold in keeping with a current value of the inflow current detected based on the current detection signal.

2. The power supply accord in to claim 1,
further comprising an input detector that detects a voltage produced by rectifying the AC voltage and outputs an input voltage detection signal,
wherein the threshold updater updates the comparison threshold to a threshold in keeping with a voltage value of the AC voltage detected based on the input voltage detection signal, out of a plurality of the thresholds for the current value of the inflow current that are present for each voltage value of the AC voltage.

3. A medical system comprising:
the power supply according to claim 2 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a fuse or a breaker interposed on the pair of power supply lines; and
a medical appliance that is connected as the load to the isolation DC/DC converter and operates based on the load voltage.

4. A medical system comprising:
the power supply according to claim 2 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a first fuse or a first breaker interposed on one power supply line out of the pair of power supply lines;
a second fuse or a second breaker interposed on the input line connected via the input terminals to another power supply line out of the pair of power supply lines; and
a medical appliance that is connected as the load to the isolation DC/DC converter and operates based on the load voltage.

5. The power supply according to claim 2,
wherein on being notified of the end of working life being reached by the working life determiner, the power factor correction circuit causes the switch to stop switching operations.

6. A medical system comprising:
the power supply according to claim 5 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a fuse or a breaker interposed on the pair of power supply lines; and
a medical appliance that is connected as the load to the isolation DC/DC converter and operates based on the load voltage.

7. A medical system comprising:
the power supply according to claim 5 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a first fuse or a first breaker interposed on one power supply line out of the pair of power supply lines;
a second fuse or a second breaker interposed on the input line connected via the input terminals to another power supply line out of the pair of power supply lines; and
a medical appliance that is connected as the load to the isolation DC/DC converter and operates based on the load voltage.

8. The power supply according to claim 1,
wherein on being notified of the end of working life being reached by the working life determiner, the power factor correction circuit causes the switch to stop switching operations.

9. A medical system comprising:
the power supply according to claim 8 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a first fuse or a first breaker interposed on one power supply line out of the pair of power supply lines;
a second fuse or a second breaker interposed on the input line connected via the input terminals to another power supply line out of the pair of power supply lines; and
a medical appliance that is connected as the load to the isolation DC/DC converter and operates based on the load voltage.

10. A medical system comprising:
the power supply according to claim 8 that further includes a pair of input, terminals connected to an input line, a primary-side rectifier that is connected via a pair of power supply lines to the pair of input terminals, rectifies the AC voltage inputted via the input, line, the pair of input terminals, and the pair of power supply lines, and outputs as the input voltage to the power factor correction circuit, an isolation DC/DC converter that generates a load voltage for a corresponding load from the DC voltage and outputs the load voltage, and a fuse or a breaker interposed on the pair of power supply lines; and
a medical appliance that is connected as the load to the isolation DC/DC converter and operates based on the load voltage.

11. A medical system comprising:
the power supply according to claim 1 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a fuse or a breaker interposed on the pair of power supply lines; and a medical appliance that is connected as the load to the isolation DC/DC converter and operates based on the load voltage.

12. A medical system comprising:

the power supply according to claim 1 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a first fuse or a first breaker interposed on one power supply line out of the pair of power supply lines;

a second fuse or a second breaker interposed on the input line connected via the input terminals to another power supply line out of the pair of power supply lines; and a medical appliance that is connected as the load to the isolation DC/DC converter and operates based on the load voltage.

13. A medical system comprising:

the power supply according to claim 1 that further includes a pair of input terminals connected to an input line, a primary-side rectifier that is connected to the pair of input terminals, rectifies the AC voltage inputted via the input line and the pair of input terminals, and outputs as the input voltage to the power factor correction circuit, and an isolation DC/DC converter that generates a load voltage for a corresponding load from the DC voltage and outputs the load voltage;

a fuse or a breaker interposed on the input line; and a medical appliance that is connected as the load to the isolation DC/DC converter and operates based on the load voltage.

14. A power supply comprising:

a power factor correction circuit that includes an inductor, a diode, a switch, and a capacitor, converts an input voltage, produced by rectifying an AC voltage, to a DC voltage, and outputs the DC voltage;

an input voltage detector that detects a voltage produced by rectifying the AC voltage and outputs an input voltage detection signal, a current detector that detects an inflow current inputted into the power factor correction circuit and outputs a current detection signal;

an output voltage detector that detects the DC voltage and outputs an output voltage detection signal;

a voltage difference detector that detects one voltage difference value out of a voltage difference value between a maximum value and a minimum value of a pulsation component of the DC voltage detected from the output voltage detection signal, a voltage difference value between a voltage value of the DC voltage at timing where the pulsation component reaches the maximum value and a voltage value of a target voltage for the DC voltage, and a voltage difference value between a voltage value of the DC voltage at timing where the pulsation component reaches the minimum value and the voltage value of the target voltage;

a working life determiner that compares the one voltage difference value and a comparison threshold set in advance and gives notification of an end of working life of the capacitor being reached when the voltage difference value has reached the comparison threshold; and a threshold updater that updates the comparison threshold to a threshold in keeping with an input power calculated from a current value of the inflow current detected based on the current detection signal and a voltage value of the AC voltage detected based on the input voltage detection signal.

15. A medical system comprising:

the power supply according to claim 14 that further includes a pair of input terminals connected to an input line, a primary-side rectifier that is connected via a pair of power supply lines to the pair of input terminals, rectifies the AC voltage inputted via the input line, the pair of input terminals, and the pair of lower supply lines, and outputs as the input voltage to the power factor correction circuit, an isolation DC/DC converter that generates a load voltage for a corresponding load from the DC voltage and outputs the load voltage, and a fuse or a breaker interposed on the pair of power supply lines; and a medical appliance that is connected as the load to the isolation DC/DC converter and operates based on the load voltage.

16. A medical system comprising:

the power supply according to claim 14 that further includes a pair of input terminals connected to an input line, a primary-side rectifier that is connected to the pair of input terminals, rectifies the AC voltage inputted via the input line and the pair of input terminals, and outputs as the input voltage to the power factor correction circuit, and an isolation DC/DC converter that generates a load voltage for a corresponding load from the DC voltage and outputs the load voltage;

a fuse or a breaker interposed on the input line; and a medical appliance that is connected as the load to the isolation DC/DC converter and operates based on the load voltage.

17. A medical system comprising:

the power supply according to claim 14 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a first fuse or a first breaker interposed on one power supply line out of the pair of power supply lines;

a second fuse or a second breaker interposed on the input line connected via the input terminals to another power supply line out of the pair of power supply lines; and a medical appliance that is connected as the load to the isolation DC/DC converter and operates based on the load voltage.

18. The power supply according to claim 14,
wherein on being notified of the end of working life being reached by the working life determiner, the power factor correction circuit causes the switch to stop switching operations.

19. A medical system comprising:
the power supply according to claim 18 that further includes a pair of input terminals connected to an input line, a primary-side rectifier that is connected via a pair of power supply lines to the pair of input terminals, rectifies the AC voltage inputted via the input, line, the pair of input terminals, and the pair of power supply lines, and outputs as the input voltage to the power factor correction circuit, an isolation DC/DC converter that generates a load voltage for a corresponding load from the DC voltage and outputs the load voltage, and a fuse or a breaker interposed on the pair of power supply lines; and
a medical appliance that is connected as the load to the isolation DC/DC converter and operates based on the load voltage.

20. A medical system comprising:
the power supply according to claim 18 that further includes a pair of input terminals connected to an input line, a primary-side rectifier that is connected via a pair of power supply lines to the pair of input terminals, rectifies the AC voltage inputted via the input line, the pair of input terminals, and the pair of power supply lines, and outputs as the input voltage to the power factor correction circuit, an isolation DC/DC converter that generates a load voltage for a corresponding load from the DC voltage and outputs the load voltage, and a first fuse or a first breaker interposed on one power supply line out of the pair of power supply lines;
a second fuse or a second breaker interposed on the input line connected via the input terminals to another power supply line out of the pair of power supply lines; and
a medical appliance that is connected as the load to the isolation DC/DC converter and operates based on the load voltage.

* * * * *